United States Patent [19]

Laude

[11] Patent Number: 4,463,028

[45] Date of Patent: Jul. 31, 1984

[54] METHOD FOR PREPARING COMPOSITE OR ELEMENTARY SEMI-CONDUCTING POLYCRYSTALLINE FILMS

[75] Inventor: Lucien D. Laude, Hautmont, France

[73] Assignee: L'Etat Belge, Représenté par le Secrétaire Général des Services de la Programmation de la Politique Scientifique, Brussels, Belgium

[21] Appl. No.: 289,695

[22] Filed: Aug. 3, 1981

[30] Foreign Application Priority Data

Aug. 5, 1980 [LU] Luxembourg ............................ 82690
Jul. 14, 1981 [LU] Luxembourg ............................ 83490

[51] Int. Cl.³ .............................................. B05D 5/12
[52] U.S. Cl. ............................ 427/53.1; 156/DIG. 80; 427/86
[58] Field of Search ........ 156/603, DIG. 88, DIG. 80; 219/121 L; 427/53.1, 86; 29/576 T

[56] References Cited

U.S. PATENT DOCUMENTS 3,585,088  6/1971  Schwuttke et al. ......... 156/DIG. 80
4,059,461  11/1977 Fan et al. ............................... 148/1.5
4,212,900  7/1980  Serlin .................................. 427/53.1

FOREIGN PATENT DOCUMENTS 2040140  4/1972  Fed. Rep. of Germany.
2020963  7/1970  France.

OTHER PUBLICATIONS

Andrew et al., "Laser-Induced Metal-to-Semiconductor Phase Transition in Mixed Al-Sb Films", *Applied Physics*, vol. 35, No. 5, Sep. 1, 1979, pp. 418-420.

Fan et al., "Solid-Phase Growth of Large Aligned Grains During Scanned Laser Crystallization of Amorphous Ge Films on Fused Silica", *Applied Physics*, vol. 36, No. 2, Jan. 15, 1980, pp. 158-161.

Vitali et al., "Laser Induced Single-Crystal Transition in Polycrystalline Silicon", *Applied Physics*, vol. 17, No. 1, Sep. 1978, pp. 111-113.

Tsu et al., "Laser-Induced Recrystallization and Damage in GaAs", *Applied Physics*, vol. 34, No. 2, Jan. 15, 1979, pp. 153-155.

WO/80/00510 (Philips Patentverwaltung).

*Primary Examiner*—Hiram H. Bernstein
*Attorney, Agent, or Firm*—Fleit, Jacobson, Cohn & Price

[57] ABSTRACT

There is described a method for preparing polycrystalline semi-conducting films comprised of two elements respectively from Groups III and V, or Groups II and VI of the Periodic Table, by irradiating with a laser beam a film which is comprised of at least two layers from elements selected with a stoichiometric ratio, said film being deposited over a non-crystalline substrate and being coated with a protective layer, which method is comprised of irradiating said film with a structured laser beam to cause crystallizing into crystallites which are regularly aligned and with a size at least equal to the thickness of the resulting film.

29 Claims, 6 Drawing Figures

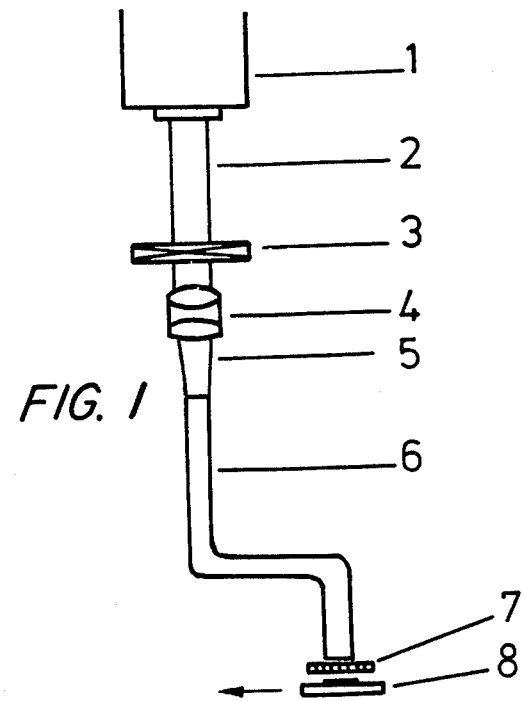
FIG. 1
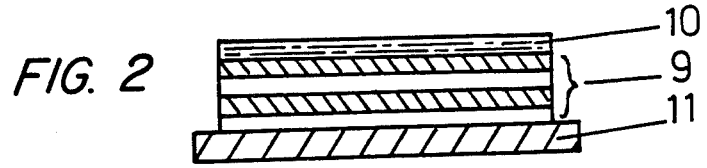
FIG. 2
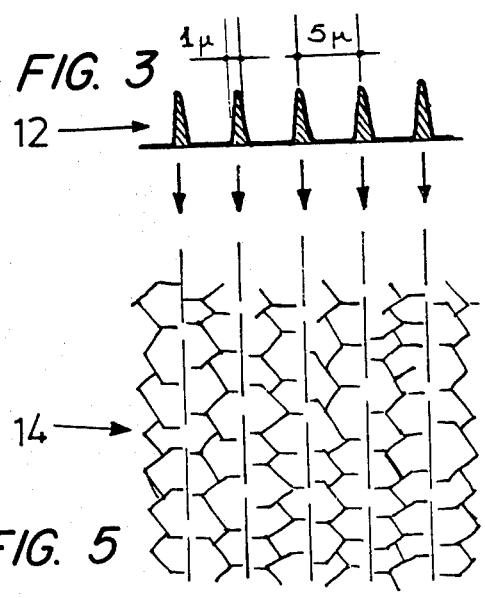
FIG. 3
FIG. 5
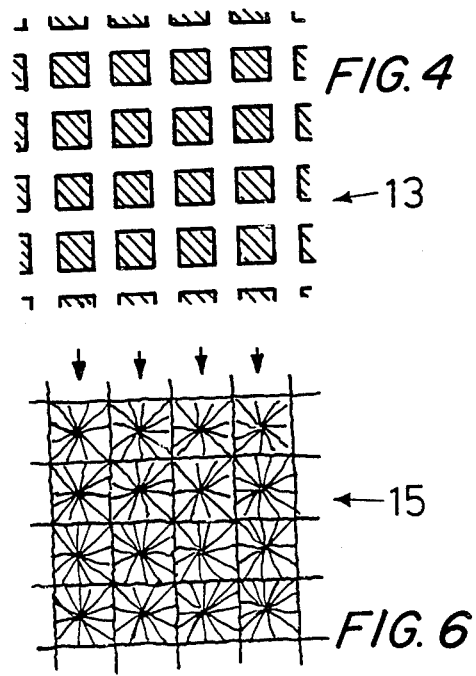
FIG. 4
FIG. 6

METHOD FOR PREPARING COMPOSITE OR ELEMENTARY SEMI-CONDUCTING POLYCRYSTALLINE FILMS

This invention relates to a method for preparing semi-conducting polycrystalline films comprised of two elements respectively from Groups III and V, or Groups II and VI of the Periodic Table, and elementary semi-conducting polycrystalline films. The invention further pertains to the resulting polycrystalline films.

It is well known that the applications for which semi-conducting compounds which associate elements from Groups III and V, and Groups II and VI of the Periodic Table might be used are manifold, particularly in the photoelectrolytic art. In this latter case, it has always been considered that it would be possible to make use of the diversity of the forbidden bands from said materials (between some 0.1 and 2.5 eV) to obtain the converter with the highest possible efficiency. Such a converter would have to comprise a forbidden band of 1.6 eV at room temperature, for example, and to retain a good efficiency for higher operating temperatures, for example in the range of 200° C. The compounds which fulfill either one of these conditions are among others, Ga As (1.35 eV), Al Sb (1.60 eV), InP (1.8 eV), Al As (2.0 eV) (Groups III and V), and CdS (2.2 eV) and CdTe (1.5 eV) (Groups II and VI). However, problems raised by the manufacture of said materials have in the past limited the development thereof. Mostly the stability and stoichiometry thereof have always caused major difficulties, which resulted in a lack of reliability for the resulting materials.

The methods used up to now to manufacture composite semi-conducting monocrystals or films are either thermic or chemical methods. The interest of said films lies in their thickness being controlled and consequently optimizable relative to the penetration of light inside the material and the optical properties thereof. In this aspect, the cost of a photoelectrolytic cell made from a semi-conducting film may be much lower than the cost of a monocrystalline cell. For such a condition to be actually true,, it is however required that said films have a very strong crystallinity in such a way that the charge transfer not be limited by the film grain size ("grain joints"). Now the size of the crystallites in films which have been thermically prepared on an amorphous non-oriented substrate (glass) is not greater than $0.1\mu$ as a rule, which makes same unfit for making junctions and consequently photoelectrolytic converters. Better crystallized deposits (notably larger size and preferential orienting of the crystallites) are obtained by epitaxial deposit on oriented substrates, for example Ga As on vacuum-split monocrystalline Ge, the atomic networks of which are very close. However it is clear that such (epitaxial) methods are:

(a) very costly, due to the requirement for using substrates which require a very elaborate previous preparing;

(b) limited to small surface areas in the range of one cm$^2$, without possibility of multiplying on a large scale;

(c) substantially unworkable in systems of the photo-battery kind in which the base (in the present case the film substrate) would have to be a very good conductor of electricity.

Other difficulties have been encountered, for example in the case of the AlSb compound which is impossible to crystallize by heating to a temperature in the range of 700° C. inside a vacuum oven; when a protecting film from SiO has been laid on the film to be previously treated by thermic treatment, there is noticed that said film does actually cause AlSb to crystallize but it also causes AlSb to diffuse into the SiO and consequently causes the deteriorating thereof on contact with water.

The obtaining of elementary crystallized films, for example from silicon by thermal processing, is possible at temperatures which are equal to or higher than 650° C.; however the size of the crystallites is limited to some $0.1\mu$ when the substrate is amorphous. By laser processing, the crystallizing is also obtained by using a continuous-mode laser, swept over the film surface to be treated with a speed which depends on the material used. The size of the crystallites is in the range of a few $\mu$, but the distribution thereof is made homogenous but when the substrate itself is thermally heated to a temperature higher than 500° C. which allows a self-sustained crystallizing of the film.

The object of the present invention is to obviate the above drawbacks and to provide a method for manufacturing composite and elementary semi-conducting films:

having crystallites with a very large size;
with a thickness in the range of several microns ($\mu$), up to 25 microns;
over the least costly carrier possible, retained at room temperature or a temperature lower than 150° C.;
over very large surface areas;
with a very great ease, allowing a thorough automatizing of the manufacture.

The method according to the invention does moreover permit protection of the manufactured films against any contamination or deterioration which might impair the future use thereof.

For this purpose, according to the invention, a method comprises irradiating, with a structured laser beam, the energy and operating sequence (pulsating or continuous) of which are adapted to the thickness of the film to be treated, an elementary amorphous semi-conducting film or a polymetallic film comprised of at least two layers and preferably a sequence of alternating layers from the elements selected according to a stoichiometric ratio, the film being deposited over a non-crystalline substrate, preferably cleaned in a vacuum, and coated with a protective layer, the structured irradiating causing the materials to crystallize into regularly-aligned crystallites with a size equal to or larger than the size of the resulting film.

In a particular embodiment of the method according to the invention, the laser beam is structured by passing through an optical means which is so arranged as to generate interference fringes.

In a particular embodiment of the method according to the invention, the laser beam is made homogeneous before being structured, by passing it through a quartz cylinder rod which is bent twice at right angles along opposite directions, and coated with a metal layer, the input and output surfaces of said rod being polished and lying in a parallel relationship with one another at right angles to the axis of the rod, the rod diameter varying from the input surface to the output surface by a factor in the range of 2.

Advantageously, when polycrystalline films are prepared from compound semi-conductors, the elements from Groups III and V, or II and VI from the Periodic Table are deposited over a non-crystalline substrate such as glass, in alternating layers with a layer thickness varying from 50 to 2000 Å depending on the element, by means of an electron gun. The elements are deposited in a specific stoichiometric ratio, the last layer being coated with a protective layer. The thickness of the various layers is controlled by vibrating quartz.

The method has also as an object the production of composite or elementary semi-conducting polycrystalline films, as obtained with the above-described methods. The resulting polycrystalline films have a total thickness up to 25 microns. As it will be seen hereinafter, use may be made of various types of laser according to the thickness of the films to be crystallized.

Other objects, features, and advantages of the invention will become apparent from the following description of particular embodiments of the invention taken together with the drawings in which:

FIG. 1 is a schematic representation of an optical set-up of the invention providing laser-irradiation of films;

FIG. 2 is an elevational view in cross-section of a composite film of the invention, obtained by succeeding deposits over an amorphous substrate, of succeeding metal layers from elements of Groups III and V, or II and VI from the Periodic Table;

FIG. 3 is a set of spaced fringes produced by diffraction of homogenized laser beam through a quartz grating according to the invention;

FIG. 4 is a grid geometry to structure the beam according to the invention;

FIG. 5 is a set of aligned compound crystallites formed with fringes of FIG. 3;

FIG. 6 is a set of patterned crystallites obtained with the grid of FIG. 4.

The following figure captions apply to the drawings:
1: laser source
2: laser beam
3: filters to reduce incident energy if necessary
4: set of lenses for concentration of the beam over the quartz pipe aperture
5: focalized beam
6: quartz pipe homogenizer
7: metallic grid or quartz grating
8: film or substrate, with lateral movement indicated
9: stack of individual metallic films being made of IIIrd (or IInd) and Vth (or VIth) columns elements
10: SiO protective layer
11: insulating (silica or glass) substrate
12: set of 1 micron wide, 5 micron spaced fringes produced by diffraction of homogenized laser beam through a quartz grating
13: grid geometry with 20×20 micron holes to structure the beam
14: set of aligned compound crystallites formed with fringes 12
15: set of patterned crystallites obtained using grid 13 a. Preparation of the films

Referring now to FIGS. 1 and 2, the preparation of the composite films occurs by succeeding deposits over an amorphous substrate 11, which is clean and non-oriented such as a glass sheet, at room temperature. Succeeding metal layers 9 from elements of Groups III and V, or II and VI from the Periodic Table are used, each layer 9 being comprised of a single element. Condensing of said metals may be obtained by various known methods: Joule effect, flash, conveying in vapour phase, electrolytic deposit, cathodic spraying, vaporizing in ultra-vacuum by electronic bombardment of a target from the material to be vaporized; this latter method is preferred in the method according to the invention due to the reliability thereof and the good adapting thereof to a large variety of materials.

To insure a perfect adhesion of the film after treating with a laser 1, cleaning of the amorphous substrate 11 (glass sheet, for instance) is obtained by ion bombardment with a neutral gas (argon, for instance) for a few minutes (between 1 and 5 minutes), then the layers from both components A and B are laid over said substrate. When use is made of alternate layers from components A and B, such layers are then laid alternately over said substrate according to a sequence ABAB . . . etc. The respective thickness of the layers from element A and element B, are controlled during the depositing by vibrating quartz. Said thicknesses are strictly in such a ratio that the numbers of atoms A and atoms B which are present in two adjacent layers AB are equal.

The thicknesses of the layers are computed from the value of the laser photonic energy absorbed, using the optical absorption factor of the elements. The layers are formed in such a way that the optical energy laid down is substantially the same in both first layers A and B. The last deposited layer being comprised of the least-absorbing material.

Taking the above in consideration, the thicknesses of the elementary layers A or B lie between 50 and 200 Å, according to the nature of elements A and B. Said thicknesses may be retained constant over the whole film thickness, said film then being comprised of a homogeneous regular piling of AB sandwiches. A first procedure comprises making the first sandwiches very thick (from $0.1\mu$ to $0.5\mu$), that is each layer may have a thickness up to 2000 Å, then lowering progressively the thickness of the following AB sandwiches to reach down to a thickness in the range of 150 Å for the last deposited AB sandwich, that is the one through which the radiation will first pass. The complete manufacturing may be automatized using the continuous thickness control.

After making a composite film according to one of both above procedures and whatever be the thickness thereof, said film is coated with a protective layer from a material such as SiO or indium-doped tin oxide (ITO), with a thickness in the range from 300 to 500 Å. The ITO has the advantage of being a good conductor of electricity while remaining transparent in the visible spectrum.

The size of the resulting films is dependent on the release characteristic of those evaporators being used. The higher the throughput, the more it is possible to prepare large surface areas without encountering a substantial thickness gradient at a right angle to the vaporizing axis.

As regards preparing films from elementary materials (silicium, germanium, etc.), use may be made of the various well-known methods of the art, notably Joule effect or electron gun for Ge and electron gun for Si.

b. Irradiating

The energy of the laser beam 2 is adjusted according to the nature of those materials which comprise the film. Various laser types may be used depending on the thickness of the films to be crystallized; pulsed dye laser with medium power and low energy (from 50 to 100 mJ/cm$^2$) for films with a thickness between 0.015 and $0.2\mu$, or pulsed ruby laser with low energy (from 50 to 100 mJ/cm$^2$ after filtering) for films with a thickness in the range from 1 to 2μ, or continuous gas laser with high energy (1 to 5 J/cm$^2$) for films with a thickness thicker than 1μ, up to 25μ.

All said films are deposited over a non-crystalline substrate 11 (glass or melted silica, for example), which has been cleaned in a vacuum.

The beam 2 is structured by passing said beam through any suitable optical means 7 for generating fringes and which may be comprised either of an optical quartz grating etched in a quartz strip, with n lines to the cm., or of a Fresnel's lens. The beam structuring may also be obtained by passing said beam 2 through a metal screen 13 with a regular mesh (20×20μ, for example, see FIG. 4) which lies at a right angle to the beam. After passing through one such optical system, the beam has a periodic distribution of fringes 12 (in parallel relationship with the grating lines, for instance see FIG. 3), or light spots (according to the screen geometry, for instance).

The film is then irradiated with said structured beam. For example by selecting previously a suitable number n of lines to the cm on the grating 7, for instance between 1000 and 6000, and/or by varying the spacing film 8 grating 7, there is obtained on the film after one pulse (pulsed mode) from the laser, straight coupled chains from crystallites which impart to the irradiated surface, a homogeneous appearance due to the presence of large crystallites which are geometrically, compactly and rectilinearly distributed. For other values of n and/or of the spacing film-grating, there is noticed after one laser pulse, the presence of rectilinear parallel chains of aligned crystallites along axes with the same spacing by a distance d. Said crystallites are directed at a right angle to said axes and spacing d varies along with the spacing between film and grating. The laser beam 2 thus prints on the film 8 the image of the grating 7 (or screen 13) in the form of alignments of crystallites and it is easy to crystallize the complete surface area by varying either the number of lines in the grating and/or the spacing film-screen.

The superimposing of a plurality of "prints" from the grating on the film does not change the form of crystallizing obtained during the first printing. By moving the film at a constant rate past the structured beam retained in a fixed position see FIG. 1, or by moving the beam past the film, a crystallizing line with a width equal to the beam diameter is obtained over the whole film length. A two-dimension sweeping allows crystallization over the whole film surface area.

As already stated in a preferred embodiment of the invention, before structuring the laser beam, said beam may be made homogeneous by passing it through any suitable known optical means in the art. The homogenizing means 6 used is preferably a cylinder-like rod made of quartz with an input diameter equal to the nominal beam diameter, which is bent twice at a right angle along the length thereof, said rod 6 being coated with a metal film such as an aluminum film for example, to limit the radiation losses, and ending with a possible reducing of the original diameter by a factor which is selected according to the surface area and energy density requirements of said beam. The input and output surfaces of the quartz rod 6 have to be accurately at a right angle to the cylinder axis and must be polished. At the output thereof, the laser beam has a flat space profile over about 95% of the diameter thereof, the remainder having a strong attenuation on the beam circumference. As shown in FIG. 1, the optical apparatus may comprise filters 3 to reduce incident energy if necessary and a set of lenses 4 for concentrating the beam over the quartz pipe homogenizer 6 as focalized beam 5.

The resulting crystallizing is easily recognized by analyzing the transmission of a white light beam through the film. For example, in the case of the AlSb system, the film has an orange colouring which is characteristic of the compound over the whole film area, while it remains completely opaque in the visible spectrum before being irradiated.

It is clear that the method according to the invention may be used with any composite or elementary films, whatever be the surface area thereof, by varying:

the laser beam energy according to the nature of those components being used;
the number of lines to the cm in the grating;
the spacing between film and grating;
the size and geometry of the screen mesh;
the spacing between film and screen;
the parameters of the surface sweeping.

All the above variables are very easy to adjust on an optical bed, they do not require a lengthy and critical focusing and consequently, make the method easy to adapt to any film while being reliable on a large scale use. Automatizing of the sweeping allows on the other hand, reduction of the manual handling required by the operator.

Among the other advantages of the invention, it should be noted that the crystallizing occurs without affecting the protective film which is transparent to the laser photons, in such a way that the crystallites are protected right from the forming thereof against any interaction with the medium, particularly water vapour, whatever be the size of the crystallites and for any film thickness.

On the other hand, the crystallizing does not cause a diffusion in the protective layer, this being due to the very short duration of the irradiating, and thus of the converting, which is in contrast to the working according to some other laser-crystallizing methods.

The problems associated with the presence of grain joints inside a polycrystalline semi-conducting film are minimized the method according to the invention, if not completely dispensed with. The size of the resulting crystallites is indeed larger than the layer thickness, which means that substantially the only grain joints present in the film connect directly the front surface (coated with the pretective layer) and the back surface (on the substrate) of the film. The electronic transfer between both said surfaces is thus very similar to the transfer encountered inside monocrystals, the grain joints then being "short-circuited" by the crystallites. The sidewise transfer is nonetheless improved by the total lowering, by about 10$^3$, of the number of grain joints relative to films obtained by thermal working. This makes it possible to substantially lower (by a few magnitudes), the series resistance $R_s$ of the crystallized films. It is known that $R_s$ is a very critical parameter ($R_s$ should be as low as possible) which controls the photoelectrolytic cell working from polycrystalline semi-conducting films.

The following examples elucidate the invention without however limiting same.

EXAMPLE 1

AlSb film (a) A film with a thickness of 2.5μ is obtained by succeeding deposits of layers from Al and Sb, with a thickness respectively of 50 Å and 92 Å, over a glass substrate with a 2×2 cm size, by vaporizing in an ultra-vacuum by succeeding electronic bombardments of an Al target and a Sb target, by means of an apparatus with 6 kW power. The deposit rate being 10 Å/sec., the making of the film requires about 45 minutes. The preparing of the film ends with the deposit of a 400 Å layer from silicium monooxide or ITO, deposited according to the same technique. At every step of the preparation, the thickness of the layers is controlled by vibrating quartz.

On an optical bed, a beam-homogenizing device is mounted at the output from a pulsed ruby laser, with attenuated energy by means of an optical filter in the range from 50 to 100 mJ/cm$^2$, the pulse duration being $2\times 10^{-8}$ sec. Homogenizing is obtained with a cylinder-like quartz rod which is bent twice at right angles along opposite directions; said rod is coated with an aluminum layer and both end surfaces thereof are polished, and are in parallel relationship and at a right angle to the rod axis; that rod surface opposite the surface arranged along the beam axis has a surface area one-half said latter one; the diameter of the output surface is 3 mm; the input surface has the same diameter as the beam. In front of the rod output, there is arranged at a right angle thereto, a quartz optical grating, comprising 4000 lines to the cm. The above-prepared film is located in front of the grating with a spacing of 1 mm thereto and in parallel relationship therewith.

The film deposited on the glass support is irradiated with a laser pulsing having 65 mJ/cm$^2$ energy and $2\times 10^{-8}$ second duration. There is then noticed over the whole irradiated surface area, regular parallel alignments from crystallites the size of which varies about 3μ which are directed at right angle to the grating lines. Said alignments which are spaced by about 6μ, are directed in parallel relationship with the large crystallites alignments.

(b) The film is then moved linearly in the plane thereof with such a rate that the succeeding pulses from the laser will strike the film by covering 90% from that surface area struck by the preceding pulse; there is thus obtained on the film a rectangular crystallized area with a width equal to the size of the laser beam and comprised of regularly aligned crystallites.

(c) By repeating the same test with a grating comprising 2000 lines to the cm and with a spacing film-grating of 1 mm, there is obtained after pulsing, parallel alignments from crystallites of about 3μ; said alignments spaced from one another by about 3μ are in this case contiguous, to the contrary of the preceding case sub (b).

(d) By repeating the same test but doing away with the optical grating in the path of the laser beam, there is obtained after pulsing, crystallites which are directed in every direction, much smaller than in the presence of the grating (as mean value, about 500 Å). The same test also but by dispensing with the grating and homogenizing device, provides crystallites which are directed in every direction, with a very varying size between 0.1 and 2μ.

EXAMPLE 2

AlSb film (a) A film with a thickness of 7μ is obtained by succeeding deposits of Al and Sb as described above, over a substrate from glass cleaned in a vacuum by ion bombardment as described above. The making of such a film lasts for 2 hours and 30 minutes, the film being protected by SiO.

The irradiating of said film is performed with a continuous gas laser (Krypton) having a high energy (3 J/cm$^2$), but a low power relative to both other pulsed lasers (dye and ruby). Without making use of a homogenizing device (the beam is very stable and homogeneous), the irradiating causes a crystallizing with very large crystallites in the irradiated area bounded by a much finer crystallizing. Typically, when the spot diameter is limited to 50μ, large crystallites of some tens of microns appear over this size, the fringe of microcrystallites covering a crown with a width of 2-3μ on the circumference.

(b) The film is then moved at right angle to the beam axis with a speed of 1 mm/sec. The crystallizing with such a dynamic rate produces AlSb crystallites of dendritic type, which are substantially aligned along the movement axis, with a width equal to approximately 10μ, over a mean length of 100μ, reaching 200μ in some cases.

(c) By using a beam which is substantially identical to the preceding one, then structured by passing through a metal grid or screen with a mesh equal to 80×80 and a cross-section equal to a few mm$^2$, the film which remains unmoving in front of the beam is crystallized according to the same characteristics (size of the crystallites) as before over the whole irradiated surface area. A movement of the film with a speed of 1 mm/sec. then causes a much larger crystallizing than according to the geometry of the preceding irradiating. Typically 3 minutes are required to irradiate and crystallize a film with a thickness of 7μ over a surface of 4 cm$^2$.

EXAMPLE 3

AlAs film (a) A film with a thickness of 0.1μ is obtained by succeeding deposits of Al and As layers respectively with a thickness of 50 Å and 80 Å, and covered with SiO according to the technique described for the AlSb film. The film is located in front of the optical system as described in example 1. However for the considered film thickness, ,se is made of a dye laser with 6 kW power, the spacing film-grating being 1 mm. The irradiating is performed with an energy of about 65 mJ/cm$^2$ and a duration of $10^{-6}$ sec. Crystallites are obtained with the same size as the crystallites obtained in example 1 with the same thicknesses.

(b) A film with a thickness of 0.2μ is obtained by succeeding deposits of two layers from Al and As, respectively with a thickness of 800 Å and 1200 Å. The procedure is pursued as sub (a) above, and there are also obtained crystallites with the same size as the crystallites obtained in example 1 with the same thicknesses.

EXAMPLE 4

Si film

By using the various laser irradiating devices as described above for amorphous Si films, with a thickness corresponding to the laser being used, there is obtained a crystallizing with large crystals having a size lying between 1 and 20μ which are distributed geometrically and homogeneously over the whole irradiated surface area.

EXAMPLE 5

A film with a thickness of 0.2μ is obtained by succeeding deposits of two layers from Cd and Te in such a way that the numbers of atoms from Cd and Te be equal, then the whole is coated with a layer from SiO, this complete preparation then being laid on a glass plate which has first been cleaned in a vacuum by spraying with a neutral gas. The system thus obtained is then irradiated with a single pulse with a duration of $10^{-6}$ sec. provided by a dye laser working substantially with 2 eV photon energy and a total power about 60 mJ/cm$^2$. The converting of the polymetal film Cd/Te on glass into a semi-conducting film CdTe is then observed over the complete irradiated surface, by measuring the optical reflectivity, with an optic absorption threshold about 1.5 eV (or 820 nm wavelength). Once the beam has been structured, irradiating with one pulse causes some crystallizing with the same quality as noted in examples 1, 2 and 3.

FIG. 3 shows a set of 1 micron wide, 5 micron spaced fringes 12 produced by diffraction of homogenized laser beam through a quartz grating, the set of aligned compound crystallizes 14 formed with fringes 12 being illustrated by FIG. 5, whereas FIG. 4 represents a grid geometry 13 with 20×20 micron holes to structure the beam, the set of patterned crystallites 15 obtained by using said grid 13 being illustrated by FIG. 6.

It must be understood that the invention is in no way limited to the above embodiments and that many changes may be brought thereto without departing from the scope of the invention as defined by the appended claims.

I claim:

1. Method for preparing polycrystalline semi-conducting films comprised of two elements from Groups III and V, respectively, or Groups II and VI, respectively, of the Periodic Table, by irradiating with a laser beam a film, said film being comprised of at least two layers each of which is formed from one of said elements selected in a stoichiometric ratio, said film being deposited over a non-crystalline substrate and being coated with a protective layer, which method is comprised of irradiating said film with a structured laser beam to cause crystallizing of said elements into crystallites which are regularly aligned and which have a size at least equal to the thickness of the resulting film, wherein said laser beam is structured by passing the beam through an optical means which is so arranged as to cause interference fringes.

2. Method as defined in claim 1, in which said film is comprised of alternating layers from said elements selected with a stoichiometric ratio.

3. Method for preparing polycrystalline elementary semi-conducting films by irradiating with a laser beam an elementary amorphous semi-conducting film, said film being deposited over a non-crystalline substrate and being coated with a protective layer, which method comprises irradiating said film with a structured laser beam to cause crystallizing said semi-conducting film into crystallites which are regularly aligned and which have a size at least equal to the thickness of the resulting film, wherein said laser beam is structured by passing the beam through an optical means which is so arranged as to cause interference fringes.

4. Method as defined in claim 1 or 3, in which said non-crystalline substrate is cleaned by ionic bombardment with a neutral gas, such as argon.

5. Method as defined in claim 1 or 3, in which said crystallites have a size larger than the thickness of the resulting film.

6. Method as defined in claim 1, in which said optical means causing interference fringes is comprised of an etched quartz optic grating.

7. Method as defined in claim 6, in which the number of etched lines in the quartz optic grating and the spacing grating-film have such values that the laser beam causes a regular crystallizing over the whole surface area with aligned crystallites.

8. Method as defined in claim 7, in which the number of lines in the optic grating varies between 1000 and 6000 to the cm.

9. Method as defined in claim 7, in which the spacing grating-film is about 1 mm.

10. Method as defined in claim 1, in which the optical means causing interference fringes is comprised of a Fresnel's lens.

11. Method as defined in claim 1, in which the optical means causing interference fringes is comprised of a metal screen or grid having a regular mesh lying at right angle to the beam axis.

12. Method as defined in claim 1 or 3, in which said laser beam irradiating the film operates in pulsed mode with an energy between 50 and 100 mJ/cm$^2$.

13. Method as defined in claim 1 or 3, in which said laser beam irradiating the film operates in continuous mode with an energy between 1 and 5 J/cm$^2$.

14. Method as defined in claim 1 or 3, in which said laser beam is made homogeneous before being structured.

15. Method as defined in claim 14, in which said laser beam is made homogeneous by passing through a quartz cylinder-like rod which is bent twice at right angle along opposite directions, coated with a metal layer, and the input and output surfaces thereof being polished, in parallel relationship together and at right angle to the rod axis, the diameter of said rod varying from the input to the output surface by a factor of about 2.

16. Method as defined in claim 1 or 3, in which the film thickness lies between 1 and 2 microns, and the laser beam is comprised of a pulsed ruby laser beam.

17. Method as defined in claim 1 or 3, in which the film thickness lies between 2 and 25 microns, and the laser beam is a continuous laser beam.

18. Method as defined in claim 1 or 3, in which the protective layer is comprised of silicon monooxide or indium-doped tin oxide.

19. Method as defined in claim 1, in which the elements from Groups III and V, or II and VI of the Periodic Table are deposited over a non-crystalline substrate in alternating layers with a thickness varying between 50 and 2000 Å depending on the nature of the element, by means of an electron gun, with stoichiometric ratios, the last layer being coated with a protective layer, the thickness of the various layers being controlled by vibrating quartz.

20. Method as defined in claim 19, in which the thicknesses from two different elementary layers which are directly adjacent to one another, each vary between 50 and 200 Å and are retained constant over the whole thickness of the total film, so as to obtain a homogeneous and regular piling of both said different elementary layers.

21. Method as defined in claim 20, in which the thickness of the elementary layers is reduced progressively over the substrate as said layers are being deposited.

22. Method as defined in claim 21, in which the first sandwiches have a thickness in the range from 0.1 to 0.5 microns, and the last sandwich has a thickness in the range of 150 Å, each sandwich being formed by two different elementary layers which are directly adjacent.

23. Method as defined in claim 20, in which the last layer being deposited is comprised of the less-absorbing element.

24. Method as defined in claim 1, in which the elements from Groups III and V are selected respectively among those element couples which comprise aluminum and antimony, aluminum and arsenic, gallium and arsenic, and indium and phosphorus.

25. Method as defined in claim 1, in which the elements from Groups II and VI are selected respectively among those element couples which comprise cadmium and sulfur, and cadmium and tellurium.

26. Method as defined in claim 3, in which the element used is silicon or germanium.

27. Method as defined in claim 3, in which said optical means causing interference fringes is comprised of an etched quartz optic grating.

28. Method as defined in claim 3, in which the optical means causing interference fringes is comprised of a Fresnel's lens.

29. Method as defined in claim 3, in which the optical means causing interference fringes is comprised of a metal screen or grid having a regular mesh lying at right angle to the beam axis.

* * * * *